US006266000B1

(12) United States Patent
Jusuf et al.

(10) Patent No.: US 6,266,000 B1
(45) Date of Patent: Jul. 24, 2001

(54) PROGRAMMABLE LED DRIVER PAD

(75) Inventors: Gani Jusuf, San Carlos; Colm P. Lysaght, Palo Alto; Ryan P. Donohue, San Jose, all of CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/303,797

(22) Filed: Apr. 30, 1999

(51) Int. Cl.[7] .................................................... H03M 1/66

(52) U.S. Cl. ........................................... 341/144; 348/703

(58) Field of Search ............................ 341/144; 348/703

(56) References Cited

U.S. PATENT DOCUMENTS 4,183,046 * 1/1980 Dalke et al. ......................... 348/703
4,464,726 * 8/1984 Chiang ................................ 341/144
4,631,522 * 12/1986 Cabot .................................. 341/144
4,779,029 * 10/1988 Henderson et al. ................. 341/118
4,920,344 * 4/1990 Henderson et al. ................. 341/118
5,479,189 * 12/1995 Chesavage et al. ................. 345/154

* cited by examiner

*Primary Examiner*—Peguy JeanPierre
*Assistant Examiner*—Jean Braner Jeanglaude
(74) *Attorney, Agent, or Firm*—Robert T. Martin

(57) ABSTRACT

A light emitting diode (LED) driver pad comprising a multiplying digital to analog converter (MDAC), which allows for differing LED characteristics to be matched digitally. Either a plurality of MDACs are integrated onto a single integrated circuit, one MDAC per color of LED, or a single MDAC may be multiplexed to drive a plurality of different color LEDs. The MDAC allows for LED operating current to be set digitally, while allowing an overall brightness or intensity control, thus achieving uniform color balance over a range of operating characteristics.

12 Claims, 3 Drawing Sheets

PROGRAMMABLE LED DRIVER PAD

BACKGROUND OF THE INVENTION

1. Field of the Invention

The present invention relates to drivers for light emitting diodes (LEDs), more particularly to drivers for LEDs of different colors.

2. Art Background

With the advent of red, green, and blue light emitting diodes (LEDs) their use in color displays has increased. Separate red, green, and blue LEDs can be combined to produce many colors and intensities of light, for example white light for backlighting displays. Ideally to obtain color balance and provide brightness control while maintaining that color balance, the individual red, green, and blue devices would have the same characteristics, such as efficiency, light output for a given drive voltage and current, and so on. This is unfortunately not the case. LEDs for the different primary colors have widely differing drive requirements, luminous outputs, and efficiencies. Additionally, process variations result in performance differences among LEDs of the same color. Consequently, means must be provided in the LED driver circuitry to allow these differing characteristics to be matched.

What is needed is an LED driver design for incorporating into an integrated circuit that allows varying LED characteristics to be easily accommodated.

SUMMARY OF THE INVENTION

A light emitting diode (LED) driver pad is disclosed which allows for varying LED characteristics to be accommodated digitally. One embodiment of the pad integrates a multiplying digital to analog converter into the driver. A second embodiment of the pad integrates a multiplying digital to analog converter with settable minimum output current. A third embodiment uses one multiplying digital to analog converter multiplexed to operate a plurality of LEDs.

BRIEF DESCRIPTION OF THE DRAWINGS

The present invention is described with respect to particular exemplary embodiments thereof and reference is made to the drawings in which.

DETAILED DESCRIPTION

When red, green, and blue LEDs are used in color displays, the drive current through them must be controlled to maintain color balance. Brightness differences in LEDs, both within a color due to manufacturing process variations, and differences in operating characteristics between different color LEDs, make this difficult. If brightness control is to be provided while maintaining color balance, drive current to the separate color LEDs must be individually set.

Figure 1:
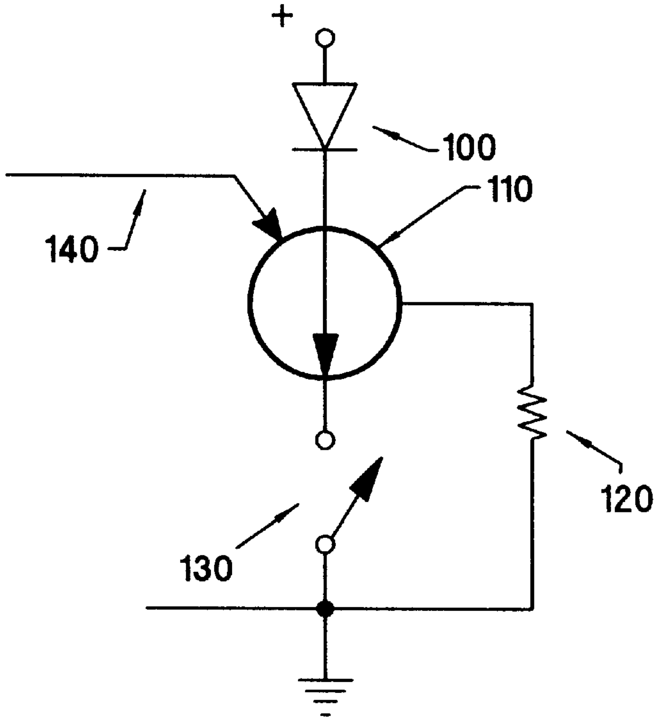
FIG. 1 shows an LED driver according to the prior art.

A prior art method of doing this, as used in the MCVVQ101 Backlight Driver integrated circuit from Motorola Inc. is shown in FIG. 1. For clarity, only one of three drivers is shown. In this driver, the current flowing through LED 100 is controlled by current source 110. The operating current is set by resistor 120. Switch 130 represents a master on/off control, and control line 140 allows for brightness control. This design is replicated three times on a single integrated circuit to control red, green, and blue LEDs. To achieve color balance, individual resistors 120 for each of the red, green, and blue drivers must be carefully and individually selected. Achieving precise color balance in the presence of process variation in LED characteristics with this driver design requires careful trimming of resistors 120.

An alternative approach to obtaining precise color balance is to carefully prescreen LEDs and select only those within a narrow operating range. A third alternative is to sacrifice color balance by going with nominal or ballpark values for the performance of LEDs 100 and resistors 120.

None of these three alternatives is particularly palatable, incurring either extra cost in screening LEDs, incurring extra manufacturing cost and time in selecting or trimming resistors 120, or sacrificing precise color balance.

Figure 2:
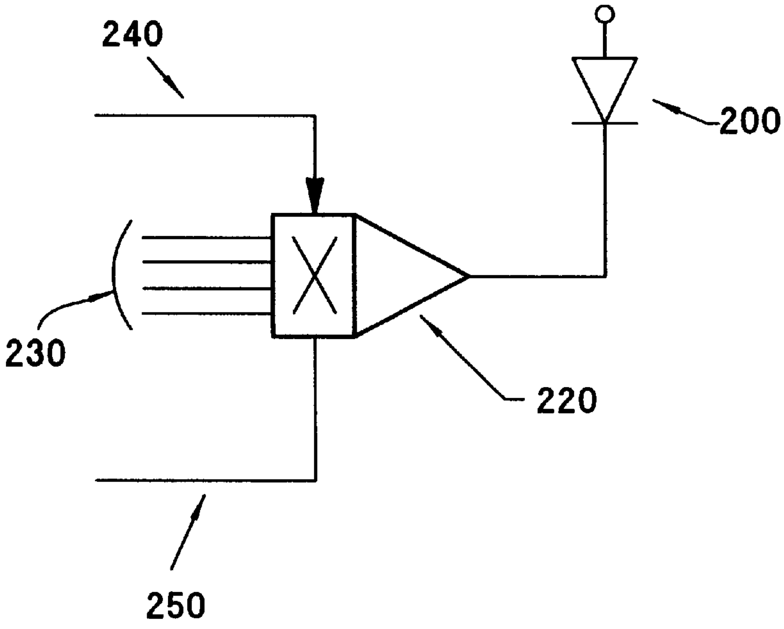
FIG. 2 shows a first embodiment of the present invention.

FIG. 2 shows a first embodiment of the present invention. A single color is shown; this design is replicated on the integrated circuit for each of the colors used, typically three times, for red, green, and blue. LED 200 is driven by multiplying digital to analog converter (MDAC) 220. Multiplying digital to analog converters are known to the art, described for example in chapter 9 of *The Art of Electronics, Second Edition,* by Horowitz and Hill, Cambridge University Press, 1989. Digital inputs 230 control LED current. Control line 240 allows for intensity control, and is common to each MDAC so that a single control line 240 controls the operation of all MDACs. Control line 250 latches the data in MDAC 220; depending on the design, this latch may not be part of the MDAC, but may be part of the overall control circuitry (not shown). With this design, current through LED 200 is set digitally, allowing the operating point of each LED to be set easily during the manufacturing process, without needing to trim or select components such as resistors or LEDs, allowing close color balance to be achieved. In practice, four to six bits of resolution are adequate for MDAC 220; additional bits provide more resolution at the expense of increased pad complexity and size. While a current output MDAC is preferred in the present invention, it is understood that a voltage output MDACs may be used, each followed by a voltage to current converter.

Figure 3:
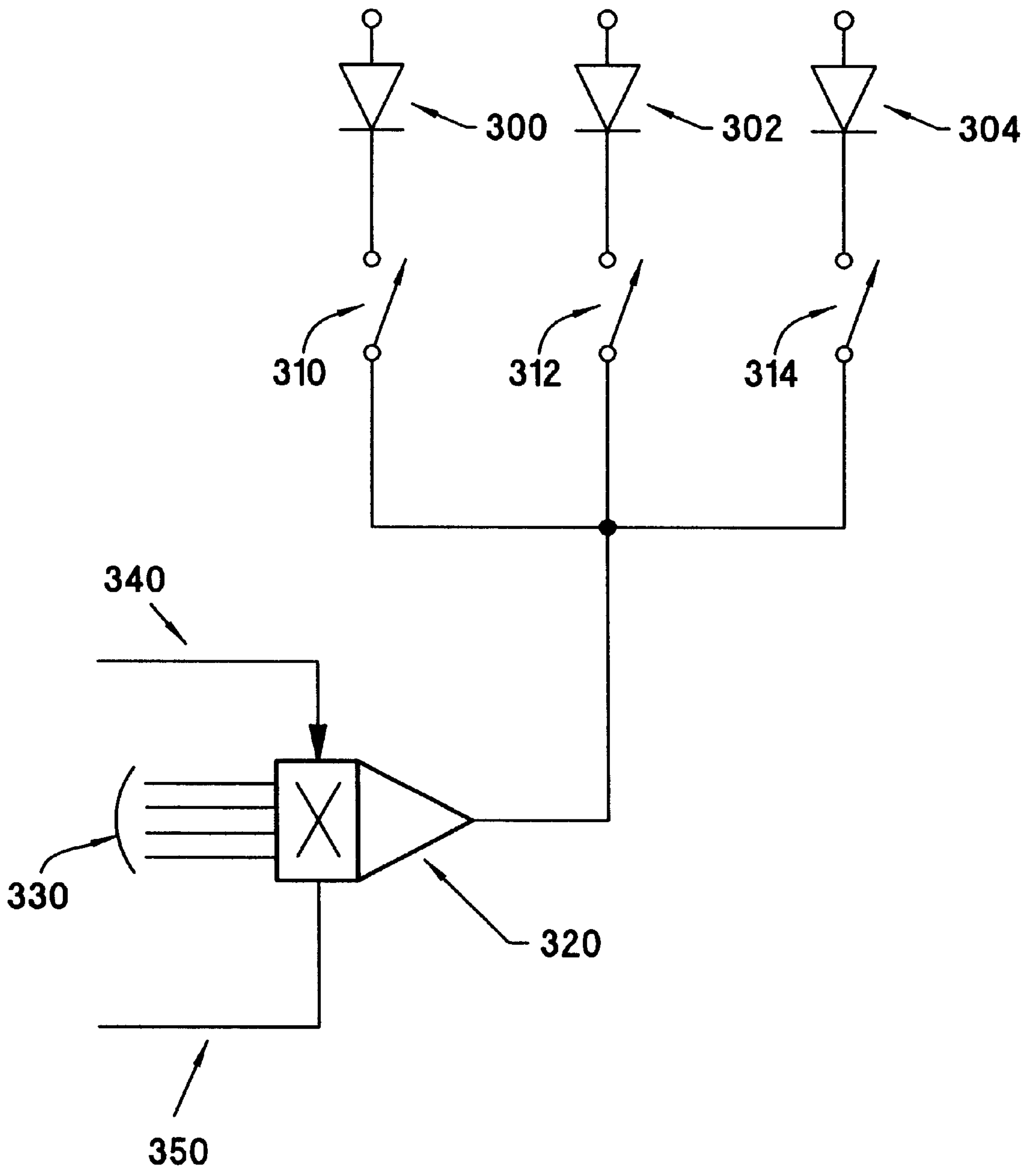
FIG. 3 shows a second embodiment of the present invention.

FIG. 3 shows a second embodiment of the present invention using a single MDAC multiplexed to drive three LEDs. LEDs 300, 302, and 304 connect to MDAC 320 through switches 310, 312, and 314 respectively. Digital lines 330 control the current, with line 340 providing intensity control and line 350 latching the data. As before, this latch may be part of MDAC 320 or may be part of the control circuitry. Where a design based on FIG. 2 uses one MDAC for each LED, FIG. 3 multiplexes a single MDAC. This requires external control circuitry (not shown) to scan across the LEDs, closing switches 310, 312, and 314 while providing the correct digital inputs for the corresponding LED at digital inputs 330 and latch control 350.

Figure 4:
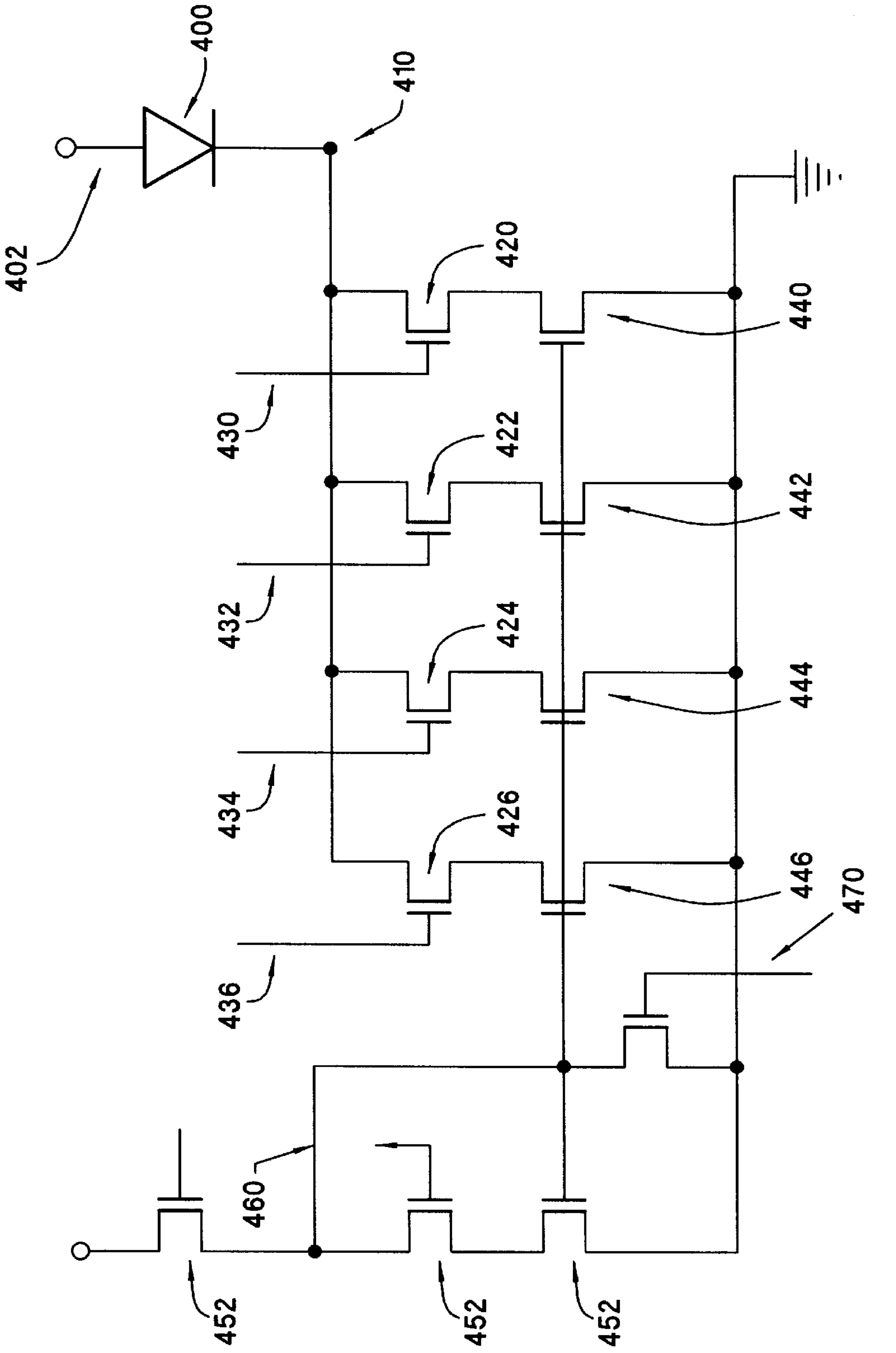
FIG. 4 shows a third embodiment of the present invention.

FIG. 4. shows an embodiment of the present MDAC invention as implemented using complimentary metal oxide semiconductor (CMOS) technology. This structure is replicated for each of the different color LEDs driven. While a 4 bit device is shown, this may be extended as is known to the art. Data latching previously described is not shown. The MDAC may also be implemented using bipolar technology, or other MOS structures known to the art. LED 400 connects between positive supply terminal 402 and switching terminal 410. Switches 420, 422, 424, 426 are controlled by their corresponding gates 430, 432, 434, 436. Current sources 440, 442, 444, 446 form a binary ladder, with each current source supplying twice the current of the previous. Thus current source 440 causes 1× the design current to flow through LED 400 and switch 420, current source 442 causes 2× the design current to flow, current source 444 causes 4× the design current to flow, and so on. This binary weighting allows the current flowing through LED 400 to be easily adjusted by turning on the appropriate switches 420, 422, 424, 426.

As shown in FIG. 4. the gates of current sources 440, 442, 444, 446 are tied together and fed from a common source comprised of transistors 450, 452, 454, and 456. By adjusting the current flowing into node 480, the voltage on gates of current sources 440, 442, 444, 446 is varied, thereby changing the current flowing through the current sources. In this manner the level of the signal presented at node 460 is effectively multiplied by the binary weighting of the current sources (440, 442, 444, 446) which are activated by their corresponding gates 430, 432, 434, 436. Gate 470 of transistor 454 provides the ability to effectively shut down the converter. When gate 470 is high, transistor 454 conducts, turning off transistors 440, 442, 444, 446, and 452. Transistor 456 provides isolation. As in FIG. 2, node 480 for each of the MDACs present are tied together, providing common control of all MDACs. Transistor 456 provides isolation between sections of each MDAC.

The MDAC of FIG. 4 may also be combined with the multiplexing arrangement shown in FIG. 3 for scanned LEDs.

In some applications it may be advantageous to keep a default amount current flowing through LED 400. Having this default amount of current flowing in the LED reduces the number of bits that must be controlled. With the default current, it may be possible to reduce the number of bits in the MDAC to two or three. This may be accomplished by keeping one bit of the MDAC turned on. In the implementations shown in FIGS. 2 and 3, this is accomplished by tying one bit of the MDAC high. This bit does not need to be the least significant bit. In an implementation such as that shown in FIG. 4, this is done by tying the gate 430 of the appropriate switch 420 high, causing current to flow continuously through current source 440 and LED 400. In another implementation, a separate switch and current source may be used, with the gate of that switch tied high.

The foregoing detailed description of the present invention is provided for the purpose of illustration and is not intended to be exhaustive or to limit the invention to the precise embodiments disclosed. Accordingly the scope of the present invention is defined by the appended claims.

What is claimed is:

1. An apparatus for driving a plurality of different color light emitting diodes comprising a plurality of multiplying digital to analog converters, one for each color of light emitting diode, the plurality of multiplying digital to analog converters integrated into a single integrated circuit.

2. The apparatus of claim 1 wherein three multiplying digital to analog converters are present on a single integrated circuit.

3. The apparatus of claim 1 wherein the resolution of each multiplying digital to analog converter is at least two bits.

4. The apparatus of claim 1 wherein the multiplying digital to analog converters are fabricated from CMOS.

5. An apparatus for driving a plurality of different color light emitting diodes comprising a plurality of current output multiplying digital to analog converters integrated into a single integrated circuit, each multiplying digital to analog converter having a plurality of digital inputs, an analog input, and a current output for driving a particular color of light emitting diode, one multiplying digital to analog converter for each color of light emitting diode, the analog inputs of each of the multiplying digital to analog converters connected together to provide a common analog input.

6. The apparatus of claim 5 wherein three current output multiplying digital to analog converters are present.

7. The apparatus of claim 6 wherein the resolution of each multiplying digital to analog converter is at least two bits.

8. The apparatus of claim 7 wherein the least significant bit of each multiplying digital to analog converter is continuously enabled.

9. The apparatus of claim 6 wherein the multiplying digital to analog converters are fabricated from CMOS.

10. An apparatus for driving a plurality of different color light emitting diodes comprising a single multiplying digital to analog converter having an analog input, a plurality of digital inputs, and an analog output, a multiplexer connected to the analog output of the digital to analog converter, the multiplexer having a plurality of outputs, one output for each color of light emitting diode, the multiplying digital to analog converter and the multiplexer present in a single integrated circuit.

11. The apparatus of claim 10 wherein the multiplexer has three outputs.

12. The apparatus of claim 10 wherein the resolution of the multiplying digital to analog converter is at least two bits.

* * * * *